US010734961B2

(12) United States Patent
Robert et al.

(10) Patent No.: US 10,734,961 B2
(45) Date of Patent: Aug. 4, 2020

(54) AUTOMATIC GAIN CONTROLLER

(71) Applicant: NXP B.V., Eindhoven (NL)

(72) Inventors: Sebastien Robert, Emieville (FR);
Fabian Rivière, Cagny (FR); Franck Bisson, Herouvillette (FR); Christophe Olivier Mertens, Leuven (BE); Samuel Becqué, Denderleeuw (BE)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/130,435

(22) Filed: Sep. 13, 2018

(65) Prior Publication Data

US 2019/0131949 A1 May 2, 2019

(30) Foreign Application Priority Data

Oct. 26, 2017 (EP) .................................... 17306479

(51) Int. Cl.
*H03G 3/30* (2006.01)
*H04B 1/10* (2006.01)
*H04B 1/18* (2006.01)

(52) U.S. Cl.
CPC ........... *H03G 3/3068* (2013.01); *H04B 1/109* (2013.01); *H04B 1/18* (2013.01); *H03G 2201/204* (2013.01); *H03G 2201/206* (2013.01)

(58) Field of Classification Search
CPC ....... H03G 2201/204; H03G 2201/206; H03G 3/3068; H04B 1/109; H04B 1/18
See application file for complete search history.

(56) References Cited

U.S. PATENT DOCUMENTS

| 5,428,824 | A | 6/1995 | Kasai |
| 6,993,291 | B2 | 1/2006 | Parssinen et al. |
| 7,426,376 | B2 * | 9/2008 | Srinivasan ........... H03G 3/3068 455/136 |
| 8,009,776 | B2 | 8/2011 | Gao |
| 8,180,308 | B1 | 5/2012 | Neng et al. |
| 8,675,789 | B2 | 3/2014 | Seller |
| 9,264,280 | B1 | 2/2016 | Waheed |

(Continued)

OTHER PUBLICATIONS

Silicon Labs Datasheet, 2016; EFR32MG1 Mighty Gecko ZigBee® & Thread SoC Family Data Sheet; Preliminary Rev. 0.9.

(Continued)

*Primary Examiner* — Nader Bolourchi (57) ABSTRACT

A receiver includes at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon. An automatic gain controller for the receiver is configured to, based on a first overload signal indicative of a first frequency range of the first amplified signal having one or more frequency components exceeding a first maximum signal power threshold and a second overload signal indicative of a second frequency range, narrower than the first, of the second amplified signal having one or more frequency components exceeding a second maximum signal power threshold, provide for control of a respective gain of one or both of the first amplifier and the second amplifier.

11 Claims, 6 Drawing Sheets

(56) References Cited

U.S. PATENT DOCUMENTS

| | | |
|---|---|---|
| 2002/0142745 A1 | 10/2002 | Kang et al. |
| 2003/0207676 A1 | 11/2003 | Hughes et al. |
| 2009/0156145 A1 | 6/2009 | Lindstrom et al. |
| 2010/0231801 A1 | 9/2010 | Lococo et al. |
| 2011/0053543 A1 | 3/2011 | Schultz et al. |

OTHER PUBLICATIONS

Liu, Yao-Hong, et al.; "A 3.7mW-RX 4.4mW-TX Fully Integrated Bluetooth Low-Energy/ IEEE802.15.4/Proprietary SoC with an ADPLL-Based Fast Frequency Offset Compensation in 40nm CMOS;" ISSCC 2015, Feb. 24, 2015; Session 13, Energy-Efficient RF Systems, 13.2.; 2015 IEEE International Solid-State Circuits Conference.

\* cited by examiner

Fig. 14 based on i) a first overload signal indicative of a first frequency range of the first amplified signal having one or more frequency components exceeding a first maximum signal power threshold; and ii) a second overload signal indicative of a second frequency range, narrower than the first, of the second amplified signal having one or more frequency components exceeding a second maximum signal power threshold; ~1401 providing for control of a respective gain of one or both of the first amplifier and the second amplifier ~1402

Fig. 15

AUTOMATIC GAIN CONTROLLER

CROSS-REFERENCE TO RELATED APPLICATIONS

This application claims priority under 35 U.S.C. § 119 of European Patent application no. 17306479.1, filed on 26 Oct. 2017, the contents of which are incorporated by reference herein.

The present disclosure relates to an automatic gain controller for a receiver. In particular, it relates to an automatic gain controller for control of the gain of one or more amplifiers of a receiver based on a first overload signal indicative of a received signal exceeding a first threshold over a first band of frequencies and a second overload signal indicative of a received signal exceeding a second threshold over a second band of frequencies narrower than the first band. It also relates to the receiver, a corresponding method and an electronic device.

According to a first aspect of the present disclosure there is provided an automatic gain controller for a receiver having at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, the automatic gain controller configured to perform the following:

based on
  i) a first overload signal indicative of a first frequency range of the first amplified signal having one or more frequency components exceeding a first maximum signal power threshold; and
  ii) a second overload signal indicative of a second frequency range, narrower than the first, of the second amplified signal having one or more frequency components exceeding a second maximum signal power threshold;
provide for control of a respective gain of one or both of the first amplifier and the second amplifier.

In one or more embodiments, the automatic gain controller is configured to provide for decreasing of the gain of the first amplifier based on the first overload signal being provided to the automatic gain controller, prior to providing for decreasing of the gain of the second amplifier based on the second overload signal being provided to the automatic gain controller.

In one or more embodiments, the automatic gain controller is configured to provide for decreasing of the gain of the first amplifier while maintaining the gain of the second amplifier at a second-amplifier predetermined maximum gain value, until a first-gain-adjustment-condition is met comprising one of (i) the first overload signal is no longer provided to the automatic gain controller and (ii) the gain of the first amplifier is set to a predetermined minimum gain value.

In one or more embodiments, the automatic gain controller is configured to provide for, only once the first-gain-adjustment-condition is met, decreasing of the gain of the second amplifier based on the second overload signal being provided to the automatic gain controller.

In one or more embodiments, the automatic gain controller is configured to provide for one or both of increasing the gain of the first amplifier to a first-amplifier predetermined maximum gain threshold and increasing the gain of the second amplifier to a second-amplifier predetermined maximum gain threshold based on the elapse of a threshold time period during which the first overload signal and the second overload signal are absent.

In one or more embodiments, the automatic gain controller is configured to provide for one or both of increasing the gain of the first amplifier to a first-amplifier predetermined maximum gain threshold and increasing the gain of the second amplifier to a second-amplifier predetermined maximum gain threshold at a periodic intervals independent of the absence or presence of the first overload signal and the second overload signal.

In one or more embodiments, the increasing of the gain of the first amplifier to the first-amplifier predetermined maximum gain threshold and increasing the gain of the second amplifier to the second-amplifier predetermined maximum gain threshold is provided by one of a:
  i) direct change to the respective predetermined maximum gain threshold;
  ii) stepwise increase in the gain to the respective predetermined maximum gain threshold.

In one or more embodiments, the automatic gain controller is configured to provide for setting of the gain of the second amplifier to a second-amplifier predetermined maximum gain threshold based on the automatic gain controller being caused to decrease the gain of the first amplifier.

In one or more embodiments, the provision of control of the respective gain of one or both of the first amplifier and the second amplifier is performed independent of signaling indicative of one or both of:
  i) the first amplified signal having one or more frequency components below a first minimum signal power threshold; and
  ii) the second amplified signal having one or more frequency components below a second minimum signal power threshold.

In one or more embodiments, the mixer is configured to provide the intermediate frequency signal having in-phase, I, and quadrature, Q, components and the second overload signal is based on one of:
  i) $|I|+|Q|$ being greater than the second maximum signal power threshold;
  ii) the maximum of $|I|$ or $|Q|$ being greater than the second maximum signal power threshold;
  iii) $|I|$ being greater than the second maximum signal power threshold.

In one or more embodiments, the automatic gain controller is configured to perform the following: based on the absence of the first and second overload signals and an RSSI signal representative of the received signal strength information of a digitized version of the second amplified signal and of a third frequency range, the third frequency range equal to or less than the second frequency range, provide for a reduction of a respective gain of one or both of the first amplifier and the second amplifier to a respective gain value based on a predetermined minimum signal-to-noise ratio for demodulation of the digitized version of the second amplified signal by the receiver.

In one or more embodiments, the automatic gain controller of any preceding claim wherein the first amplified signal includes a plurality of channels spread over the first frequency range and the second frequency range comprises one of said channels.

According to a second aspect of the present disclosure there is provided a receiver comprising the automatic gain controller of any preceding claim, wherein the receiver comprises an input to receive the received signal, a first amplifier configured to receive the received signal and provide a first amplified signal based thereon, a mixer configured to receive the first amplified signal and provide an intermediate frequency signal based thereon and a second amplifier configured to receive the intermediate frequency signal and provide a second amplified signal based thereon for demodulation;

a first overload detector coupled to an output of the first amplifier and prior to the mixer and configured to provide the first overload signal;

a second overload detector coupled to an output of the second amplifier and configured to provide the second overload signal.

In one or more embodiments, the first overload detector and the second overload detector each comprise a single output to provide the respective first and second overload signal.

According to a third aspect of the present disclosure there is provided a method of operation of an automatic gain controller for a receiver having at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, the method comprising:

based on
i) a first overload signal indicative of a first frequency range of the first amplified signal having one or more frequency components exceeding a first maximum signal power threshold; and
ii) a second overload signal indicative of a second frequency range, narrower than the first, of the second amplified signal having one or more frequency components exceeding a second maximum signal power threshold;
providing for control of a respective gain of one or both of the first amplifier and the second amplifier.

According to a fourth aspect of the present disclosure there is provided an electronic device including the automatic gain controller of the first aspect or the receiver of the second aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

This ability of a receiver to effectively receive a weak signal in the 2.4 GHz ISM band in the presence of a strong interferer, such as a WiFi based interferer, is becoming a key parameter in the evaluation of the performance of a receiver. The immunity of a receiver can be considered in two main parts: firstly, the intrinsic performance of the receiver in terms of one or more of noise, linearity and phase noise among other factors and, secondly, the ability of an automatic gain controller (AGC) of a receiver to detect the presence of the interferer in the received signal and to react in a fast way to adjust the gain of the receiver in order to be able to receive the wanted signal in a specific channel even with the presence of a strong interferer in a different channel. The gain of the receiver may need to be quickly adjusted in order to put the receiver in a state that corresponds to a trade-off between noise and linearity.

In one or more examples, the ability of the AGC to effectively determine the presence of an interferer may be important. In one or more examples, the AGC may be configured to provide for gain control in response to WiFi based interferer signals. In particular, the receiver in which the AGC may be incorporated may be configured to receive IEEE 802.15.4 signals at substantially 2.4 GHz or Bluetooth Low Energy (BLE) signals. In one or more examples, the receiver including the AGC may comprise an Internet of Things (IoT) wireless microcontroller. Such IoT microcontrollers may require a very low power radio (for long battery life time, for example) and/or a small size/substrate area (for a low cost wireless sensor, for example). Moreover, much of the time an IoT microcontroller, functioning as a wireless sensor for example, may be in off-state mode (<0.1% duty cycle activity, for example). Such a configuration results in technical limitations in that the microcontroller may not be able to or it may not be preferable to continuously survey for the presence of interferers in its vicinity. For efficient reception of IEEE 802.15.4 BLE signals, the receiver and, in particular, the AGC may require a fast convergence time. For example, the preamble in BLE in only 8 µs long, and the AGC system has to converge to an appropriate gain setting for amplifiers of the receiver during those 8 µs.

Figure 1:
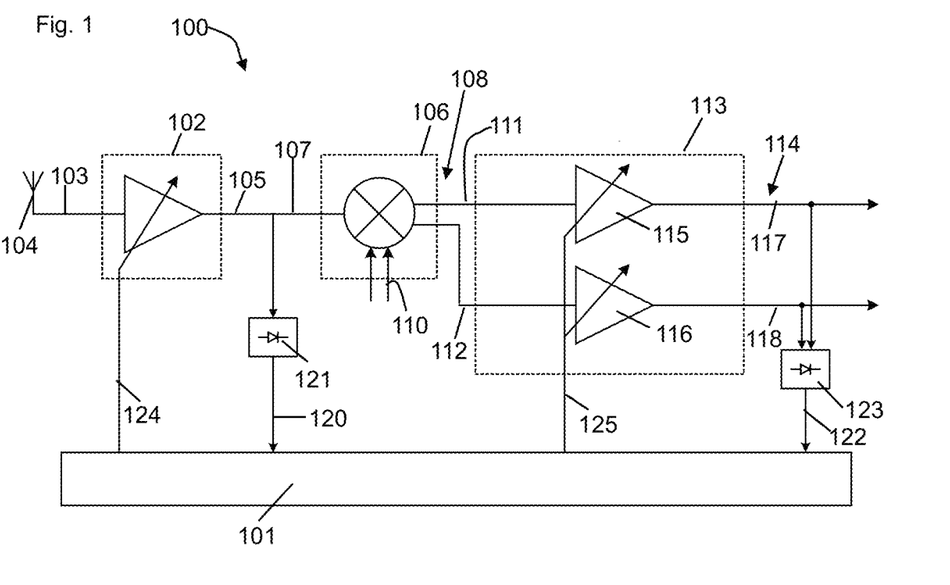
FIG. 1 shows a first example embodiment of a receiver including an example automatic gain controller.

FIG. 1 shows a first example receiver 100 including an automatic gain controller 101. The receiver 100 comprises a plurality of components coupled in a receiver chain, as described below.

The receiver 100, of this first example, comprises at least a first amplifier 102 configured to receive a received signal at an input 103, such as from antenna 104, and provide a first amplified signal based thereon at an output 105. The first amplifier 102 has a programmable gain, G1. The first amplifier 102 may comprise a low noise amplifier. In one or more examples, the first amplifier 102 may comprise the amplifier in the receiver that initially provides for amplification of the received signal. The first amplified signal provided by the first amplifier 102 may extend over a first, relatively wide, frequency range. The first amplified signal may be unfiltered. The first amplifier 102 may have a bandwidth of a first frequency range.

The receiver 100 may further comprise a mixer 106 having an input 107 coupled to the output 105 of the first amplifier 102. The mixer 106 is configured to receive the first amplified signal and provide an intermediate frequency (IF) signal based thereon at an output 108. The mixer 106 may also receive a local oscillator signal at 110 to mix with the first amplified signal to provide the intermediate frequency signal. The mixer 106 may be configured to provide in-phase and quadrature components at the output 108 or a differential output (shown in FIG. 5). In this example, the output 108 of the mixer 106 comprises two output lines 111, 112 each carrying a respective one of the in-phase and quadrature components of the intermediate frequency signal.

The receiver 100 may further comprise a second amplifier 113 configured to receive the intermediate frequency signal at an input and provide a second amplified signal at an output 114 based thereon. In this and other examples, the second amplifier 113 comprises two component amplifiers 115, 116, the first component amplifier 115 configured to amplify the in-phase component of the intermediate frequency signal and the second component amplifier 116 configured to amplify the quadrature component of the intermediate frequency signal. The second amplifier 113 has a programmable gain, G2 and, in particular, each of the component amplifiers 115, 116 have a programmable gain G2. In one or more examples, the gain of the component amplifiers 115, 116 may be settable independently of one another and in other embodiments they are settable to a common gain. The output 114, in this example, comprises two output lines 117, 118 each carrying a respective one of the in-phase and quadrature components of the second amplified signal. The second amplified signal provided by the second amplifier 113, 115, 116 may extend over a second, relatively narrow frequency range compared to the first frequency range. The second amplifier may have a bandwidth of the second frequency range. The first frequency range may cover a plurality of channels comprising designated frequencies at which reception of a signal is possible while the second frequency range may cover a subset of those channels or one of those channels. Said subset or one of the channels may be channel(s) on which a signal that is wanted by the receiver is expected or received.

The wider first frequency range and narrower second frequency range may be provided by the bandwidth of one or more of the first amplifier 102, mixer 106 and second amplifier 113. In one or more examples, components that provide for filtering of the signal may be coupled between the above-mentioned components, such as low-pass, high-pass or band-pass filters to provide, at least in part, the first and second frequency ranges.

In one or more examples, the output 114 of the second amplifier 113 may be coupled to an analogue to digital convertor (not shown). The analogue to digital convertor may provide its output to a digital domain part of the receiver (not shown) to provide for digital based processing of the digitized second amplified signal provided by the aforementioned analogue domain part of the receiver 100.

The automatic gain controller 101, in this example, comprises part of a digital controller of the receiver 100. The AGC 101 may be configured to receive a first overload signal at input 120 indicative of the first frequency range of the first amplified signal having one or more frequency components exceeding a first maximum signal power threshold. The first overload signal may be provided by a first peak detector 121 coupled to receive the first amplified signal from the output 105 of the first amplifier 102.

The AGC 101 may be configured to receive a second overload signal at input 122 indicative of the second frequency range, narrower than the first, of the second amplified signal having one or more frequency components exceeding a second maximum signal power threshold. The second overload signal may be provided by a second peak detector 123 coupled to receive the second amplified signal from the output 114 of the second amplifier 113.

Accordingly, the peak detectors 121, 123 comprise examples of overload detectors as they are configured to provide signaling to the AGC 101 based on the respective signal in the receiver chain being greater than or exceeding a predetermined threshold. Other overload detectors may be used such as an RMS detector.

The AGC 101 is configured to provide for control of the gain of the first amplifier 102 which is configured to amplify said wideband signal and provide for control of the gain of the second amplifier 113 which is configured to amplify said narrower band signal by way of a first gain control signal G1 provided at output 124 and a second gain control signal G2 provided at output 125, respectively. The outputs 124 and 125 are coupled to the first and second amplifiers 102, 113 of the analogue domain part of the receiver 100.

Figure 2:
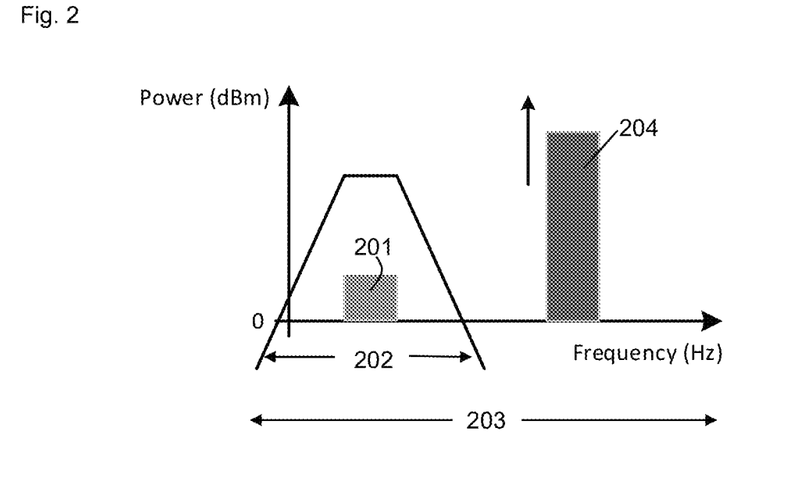
FIG. 2 shows an example signal power versus frequency diagram to illustrate a possible arrangement of a wanted signal and an interfering blocker signal.

FIG. 2 illustrates a signal power profile over a range of frequencies. The graph 200 shows a wanted signal 201 within narrow frequency range 202 provided by intermediate frequency filtering of a wider frequency range 203. The wider frequency range 203 includes an interferer signal 204. The automatic gain controller 101 is configured to operate based on first and second overload signals. The first overload signal is indicative of a first frequency range, such as range 203, having one or more frequency components exceeding a first maximum signal power threshold (not shown in FIG. 2). The second overload signal is indicative of a second frequency range, such as range 202, narrower than the first range 203 and contained within it in this example, having one or more frequency components exceeding a second maximum signal power threshold (not shown in FIG. 2). Accordingly, the automatic gain controller 101 may advantageously control the gain of the amplifiers not just based on interferer signals present in the narrower frequency range 202 where the wanted signal lies but also in range 203 and may therefore see interferer signals in adjacent channels that may lead to degradation of the wanted signal.

If the interferer signal is OFDM modulated (or any modulation scheme having AM modulation), then a large amount of intermodulation may be created in the first amplified signal from the first amplifier. These intermodulation products may lead to a degraded signal-to-noise ratio for the receiver and may prevent successful demodulation of the wanted signal 201. It should be noted that the intermodulation products can be generated in one or more of the first amplifier 102, the mixer 106, the second amplifier 113 or from any filters present in the receiver. Thus, the AGC 101 basing control of the gain of the amplifiers on occurrence of an overload in both the wider band frequency range and the narrower band frequency range may, in some embodiments, be advantageous.

In one or more examples, the control of the gain, by the AGC 101, of one or both of the first amplifier 102 and the second amplifier 113 is performed based only on one or more overload signals, including the first overload and second overload signals. The one or more overload signals may themselves be based on a measurement of a signal in the receiver and, in particular in the analogue domain part of the receiver, exceeding a threshold. In one or more examples, the control of the gain, by the AGC 101, of one or both of the first amplifier 102 and the second amplifier 113 is performed independently of one or more underload signals comprising signals (i) indicative of the first frequency range of the first amplified signal having one or more frequency components below a first minimum signal power threshold and/or (ii) indicative of the second frequency range of the second amplified signal having one or more frequency components below a second minimum signal power threshold. The use of only overload signals may be advantageous as the one or more detectors 121, 123 require only one output to report an overload condition.

In one or more examples, the use of only overload signals may lead to none, one or more of lower power consumption, reduced area usage, faster convergence time because a traditional overload/underload AGC system is often based on a fast attack/slow decay mechanism and the need to remember the previous peak value in case of OFMD signal. Such a receiver may be easier to design because without the need for an underload detector there is no need for the accurate detection of very small signals, which is difficult.

Figure 3:
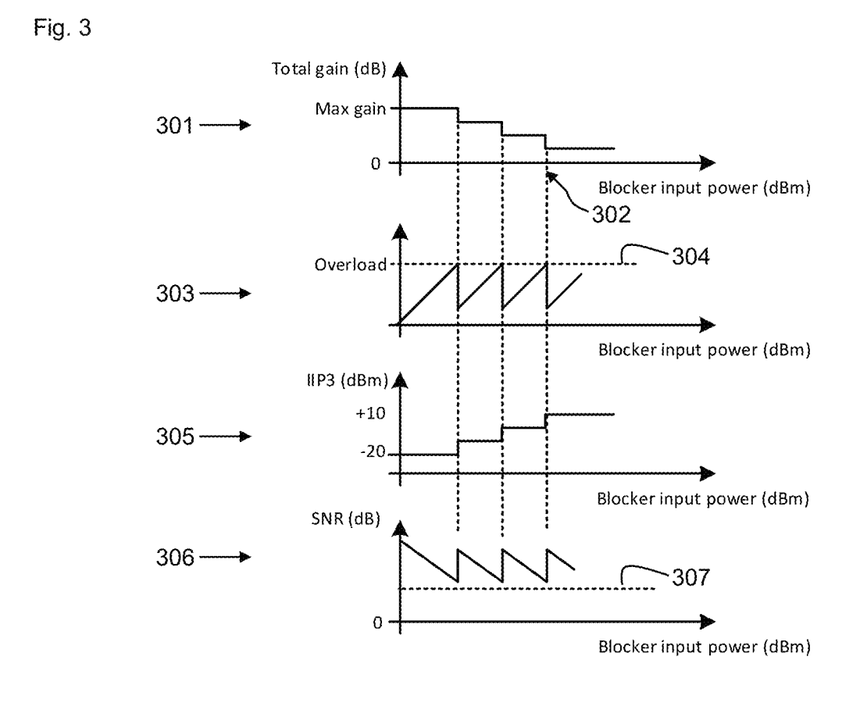
FIG. 3 shows a series of example graphs illustrating the reduction of the gain of one or more amplifiers and the effect on the third order intercept point of the receiver and the signal to noise ratio.

FIG. 3 shows, in the first plot 301, the AGC 101 incrementally controlling, by reducing, the gain G1 based on the receipt of the first overload signal until a time 302 when the first overload signal is no longer received.

The second plot 303 shows the power of the first amplified, on which the first overload signal is based versus interferer 204 signal power. The first maximum signal power threshold is shown as dashed line 304.

The third plot 304 the linearity of IIP3 of the intermediate frequency at corresponding times to the above reductions in gain G1.

The fourth plot 306 illustrates the signal to noise ratio (SNR) of the wanted signal with increasing interferer signal. A minimum SNR for functioning of the demodulator is shown as dashed line 307.

Figure 4:
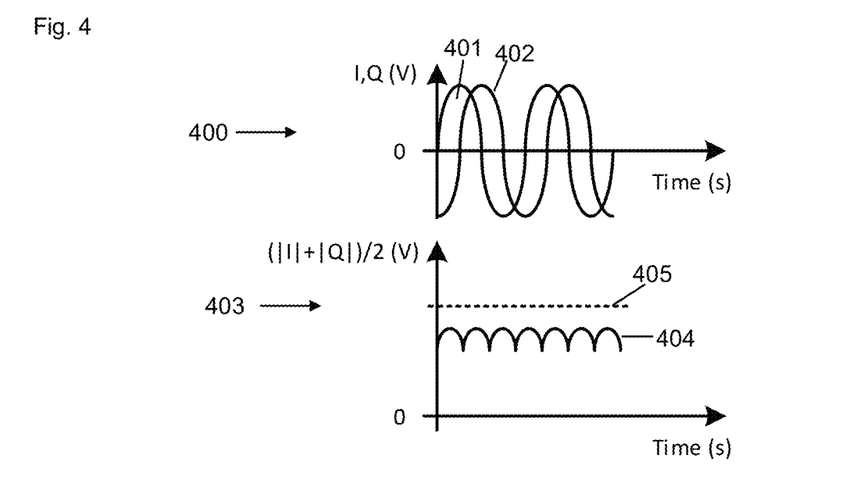
FIG. 4 shows in-phase and quadrature components of a signal and the corresponding peak detection performed by an example peak detector.

In this example, the second overload detector 123 operates in the IF domain and receives both I and Q components of the second amplified signal from second amplifier 113. FIG. 4, in upper plot 400 shows an example of said I component 401 and said Q component 402 with time. The lower plot 403 shows the function of (|I|+|Q|)/2 at 404. The second overload detector 123 may be configured to provide the second overload signal when said function 404 exceeds the second maximum signal power threshold 405. In other embodiments, different measures of the second amplified signal may be compared to appropriate second maximum signal power thresholds 405 by the second overload detector 123. For example, the provision of the second overload signal may be based on rectified I and Q values such as:
 i) |I|+|Q| being greater than the second maximum signal power threshold;
 ii) the maximum of |I| or |Q| being greater than the second maximum signal power threshold; or
 iii) |I| being greater than the second maximum signal power threshold; as well as the above described (|I|+|Q|)/2 being greater than the second maximum signal power threshold.

If one or more of the above conditions are not met then the second overload signal is not provided to the AGC 101. Similarly, the signal amplitude or power measured by the first overload detector may be compared to a first maximum signal power threshold and if it is exceeded the first overload signal may be provided and if it is not exceeded, no first overload signal is provided.

In one or more examples, the AGC 101 may be configured to provide for control, such as by incremental reduction, of the gain of first amplifier 102 based on the first overload signal. Said control may be independent of the second overload signal. In one or more examples, the AGC 101 may be configured to provide for control, such as by incremental reduction, of the gain of second amplifier 113 based on the second overload signal. Said control may be independent of the first overload signal.

In one or more embodiments, the AGC may be configured to prioritise control of the gain of the first amplifier 102 over control of the gain of the second amplifier 113. Thus, the automatic gain controller may be configured to provide for decreasing of the gain of the first amplifier 102 based on the first overload signal being provided to the automatic gain controller 102 by the overload detector 121, prior to providing for decreasing of the gain of the second amplifier 113 based on the second overload signal being provided to the automatic gain controller 102 by the overload detector 116. The automatic gain controller may be configured to provide for decreasing of the gain of each of the respective amplifiers until the respective overload signal is no longer received and, in particular, until a time based on an overload signal transition comprising the transition of the respective overload signal from being provided to no longer being provided.

In one or more examples, the automatic gain controller may be configured to provide for decreasing of the gain of the first amplifier 102 while maintaining the gain of the second amplifier 113 at a second-amplifier predetermined maximum gain value, until a first-gain-adjustment-condition is met. The second-amplifier predetermined maximum gain value may be predetermined based on the operating performance of the second amplifier 113. The first-gain-adjustment-condition may comprise one of (i) the first overload signal is no longer provided to the automatic gain controller, e.g. based on the occurrence of an overload signal transition and (ii) the gain of the first amplifier 102 is set to a predetermined minimum gain value. Thus, the AGC 102 may continue to incrementally reduce the gain G1 until a minimum gain is reached or the first overload signal stops being provided, whichever occurs first.

In one or more examples, the automatic gain controller may be configured to provide for, only once the first-gain-adjustment-condition is met, decreasing of the gain of the second amplifier 113, 115, 117 based on the second overload signal being provided to the automatic gain controller. In one or more examples, the automatic gain controller may be configured to provide for decreasing of the gain of the second amplifier 113 until a second-gain-adjustment-condition is met. The second-gain-adjustment-condition may comprise one of (i) the second overload signal is no longer provided to the automatic gain controller, e.g. based on the occurrence of an overload signal transition and (ii) the gain of the second amplifier 113 is set to a predetermined minimum gain value of the second amplifier. Thus, the AGC 102 may continue to incrementally reduce the gain G2 until a minimum gain is reached or the second overload signal stops being provided, whichever occurs first.

Figure 5:
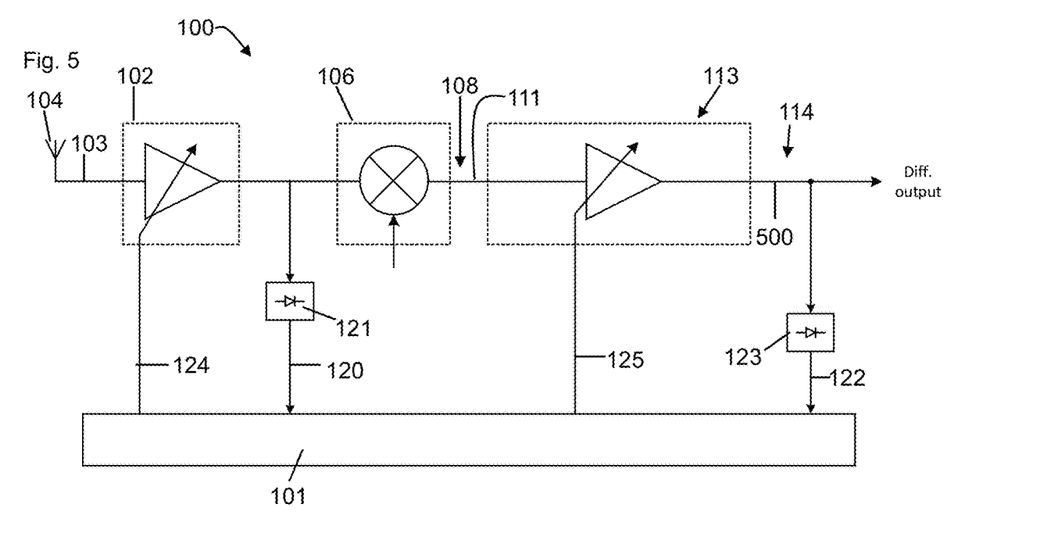
FIG. 5 shows a second example embodiment of a receiver including an example automatic gain controller.

FIG. 5 illustrates a second example embodiment of the receiver 100. This example is substantially identical to the embodiment shown with reference to FIG. 1 and therefore the same reference numerals have been used. However, in this example the intermediate frequency signal provided at the output 108 of the mixer 106 comprises a differential signal. Accordingly, in this embodiment, the second amplifier 113 is configured to amplify this differential intermediate signal to provide a single second amplified signal at output 500. Further, in this example, the overload detector 123 is configured to generate its second overload signal based on said single, differential, second amplified signal from output 500.

Figure 6:
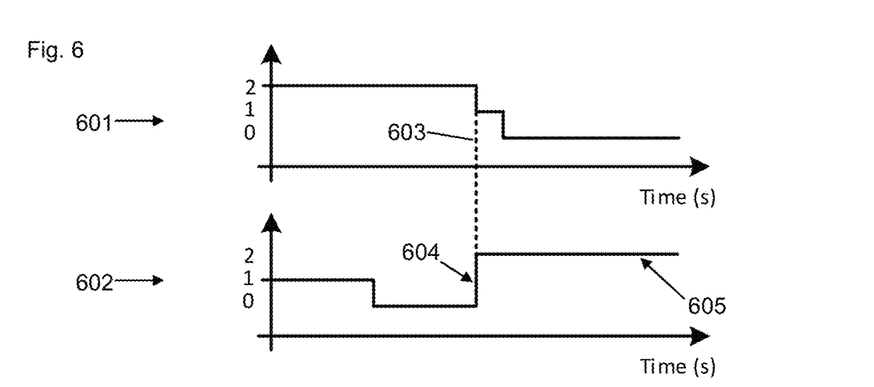
FIG. 6 shows a first example of gain control provided by the automatic gain controller.
Figure 7:
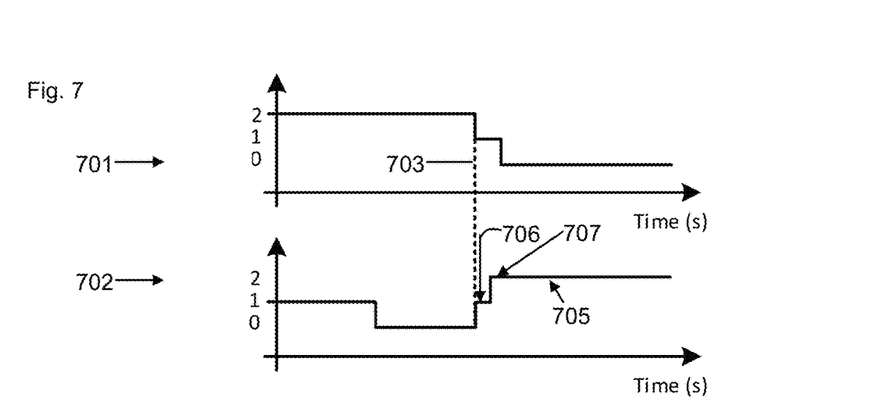
FIG. 7 shows a second example of gain control provided by the automatic gain controller.

With reference to FIGS. 6 and 7, in one or more embodiments, the automatic gain controller 101 may be configured to provide for setting of the gain G2 of the second amplifier 113 to a second-amplifier predetermined maximum gain threshold based on the automatic gain controller 101 being caused to decrease the gain G1 of the first amplifier 102. Thus, the AGC 101 resets the gain G2 of the second "IF" amplifier to its maximum each time the gain of the first amplifier 102 is decreased.

FIG. 6 shows a first example of such an action by the AGC 101. In FIG. 6, the gain of the first amplifier 102 is shown in the first plot 601 and the gain of the second amplifier 113 is shown in the second plot 602. In this example, the amplifiers are shown to have three arbitrary gain levels labelled 0, 1 and 2. Initially, the gain of the first amplifier 102 is set to level "2" and is the reduced to "1" at time 603. Initially, the gain of the second amplifier 113 is set to level "1" and subsequently reduced to level "0" prior to time point 603. However, at time point 603, when the AGC 101 provides for decrease of the gain G1 of the first amplifier 102, the AGC 101 is caused to provide for increasing of the gain G2 of the second amplifier at 604 to its second-amplifier predetermined maximum gain threshold of level "2", shown as 605.

FIG. 7 shows a second example of the action by the AGC 101 as an alternative to that shown in FIG. 6. In FIG. 7, like in FIG. 6, the gain of the first amplifier 102 is shown in the first plot 701 and the gain of the second amplifier 113 is shown in the second plot 702. Initially, the gain of the first amplifier 102 is set to level "2" and is the reduced to "1" at time 703. Initially, the gain of the second amplifier 113 is set to level "1" and subsequently reduced to level "0" prior to time point 703. However, at time point 703, when the AGC 101 provides for decrease of the gain G1 of the first amplifier 102, the AGC 101 is caused to provide for increasing of the gain G2 of the second amplifier at 604 to its second-amplifier predetermined maximum gain threshold of level "2", shown as 705. However, in this example the increase to the second-amplifier predetermined maximum gain threshold is performed incrementally to include one or more intermediate gain G2 levels, i.e. gain level "1" at 706 (if available), prior to reaching the second-amplifier predetermined maximum gain threshold at 707.

Figure 8:
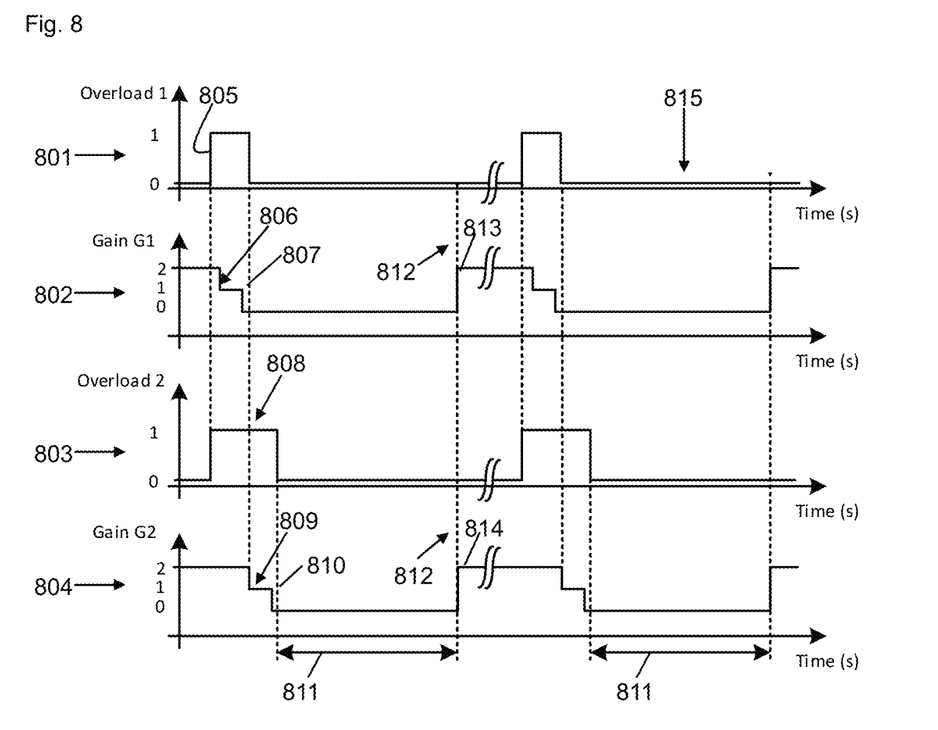
FIG. 8 shows a third example of gain control provided by the automatic gain controller.
Figure 9:
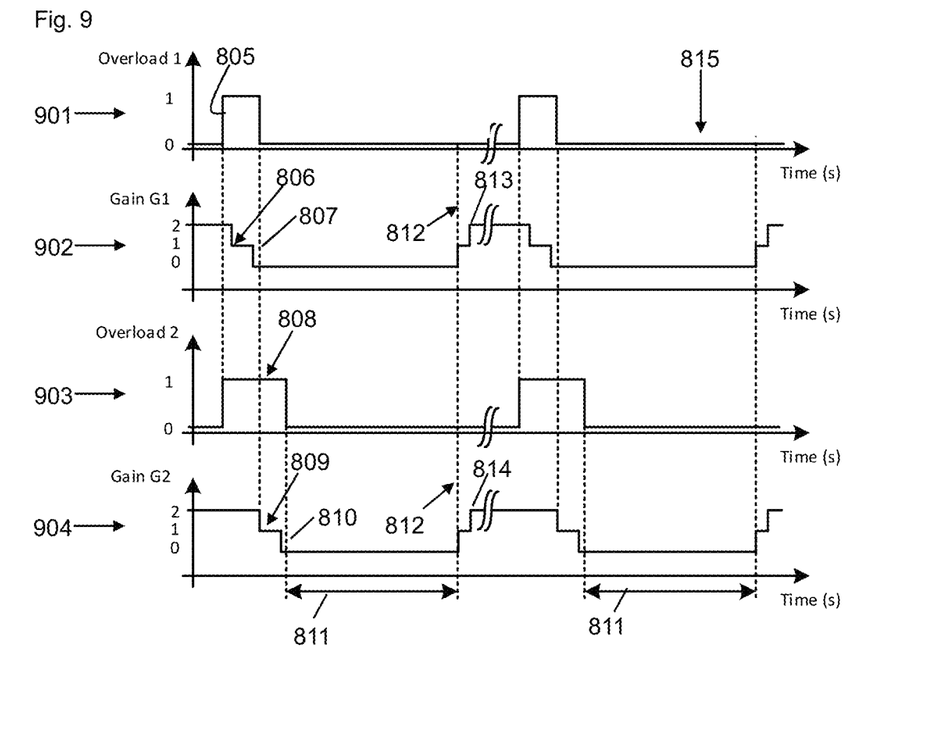
FIG. 9 shows a fourth example of gain control provided by the automatic gain controller.

With reference to FIGS. 8 and 9, the AGC 101, based on the elapse of a time-based condition, may be configured to reset the gain G1 of the first amplifier 102 and the gain G2 of the second amplifier 113 to a maximum gain. This strategy may enable the AGC to operate effectively despite not having underload information but only overload information from the first and second overload signals. Such a strategy may enable the AGC 101 to recover the sensitivity of the receiver when the incoming, received signal becomes weak or the interference conditions change (e.g. the interferer signal 204 disappears or is present with a weaker power level).

FIGS. 8 and 9 illustrate a first example in which the automatic gain controller is configured to provide for one or both of increasing the gain of the first amplifier to a first-amplifier predetermined maximum gain threshold and increasing the gain of the second amplifier to a second-amplifier predetermined maximum gain threshold based on the elapse of a threshold time period during which the first overload signal and the second overload signal are absent.

Thus, if the threshold time period is reached for a continuous period in which the first overload signal and the second overload signal are not provided to the AGC 101, then the AGC is configured to provide for increasing of the gain G1 and or gain G2.

In FIG. 8, a series of plots are shown that cover corresponding times. The first plot 801 shows the state of the first overload signal in which level "0" indicates that the first overload signal is not received by the AGC and level "1" indicates that the first overload signal is received by the AGC. The second plot 802 shows the signaling provided by the AGC to change the gain level G1. The third plot 803 shows the state of the second overload signal in which level "0" indicates that the second overload signal is not received by the AGC and level "1" indicates that the second overload signal is received by the AGC. The fourth plot 804 shows the signaling provided by the AGC to change the gain level G2.

At time 805, the AGC 101 receives the first overload signal. In this example, the AGC also receives the second overload signal at time 805. Accordingly, the AGC provides for adjustment of the gain G1 first at 806. The gain is incrementally decreased until the first-gain-adjustment-condition is met. In this example, the first overload signal is no longer provided to the automatic gain controller 101 at time 807 which also happens to be when the gain of the first amplifier 102 is set to a predetermined minimum gain value (level "0"). The AGC thus stops decreasing the gain G1 and maintains the gain of the first amplifier 113 at the gain level reached.

At time point 807, the second overload signal is still being received at 808. Accordingly, the AGC 101 provides for incremental decreasing of the gain G2 at 809. The gain is decreased until the second-gain-adjustment-condition is met. At time 810, the second overload signal stops being received and thus the second-gain-adjustment-condition is met and the AGC stops decreasing the gain G2 and maintains the gain of the second amplifier 113 at the gain level reached. In this example, the time 810 when the second overload signal is no longer provided also happens to be when the gain of the second amplifier 113 is set to a predetermined minimum gain value (level "0").

Thus, at time 810 the first overload signal is not provided and the second overload signal is not provided. In this example, this defines the start of the threshold time period 811. After the elapse of the threshold time period 811, without the first overload signal and second overload signal being received, the AGC 101 provides for increasing of the gain G1 and the gain G2 at time 812 to maximum gain values shown as 813 and 814. A similar procedure to that described above is followed should the overload signals be received on setting the gain G1 and G2 to the maximum values.

The plots 801-804 show a further occurrence of time period 811 in region 815 of the plots.

FIG. 9 shows a further example which is substantially similar to FIG. 8. However, in this example, at time point 812, the AGC provides for increasing of the gain of the first amplifier 102 to the first-amplifier predetermined maximum gain threshold 813 and the increasing the gain of the second amplifier 113 to the second-amplifier predetermined maximum gain threshold 814 by a stepwise increase in the gain rather than as a direct change as shown in FIG. 8.

The increases to the gains G1 and G2 is performed simultaneously in this example but in other examples priority could be given to increasing one of the gains G1, G2 over the other.

Figure 10:
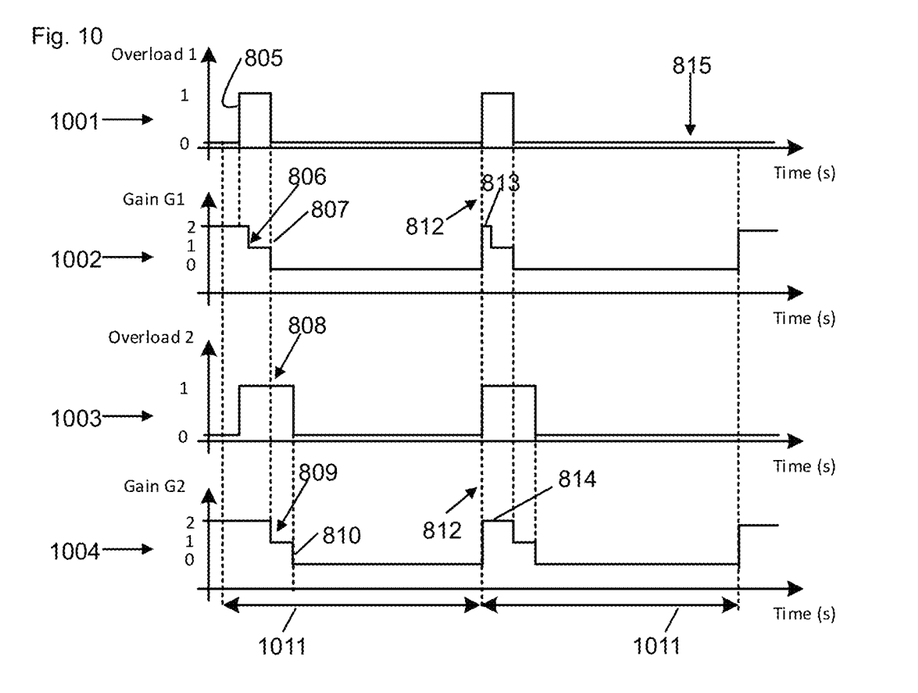
FIG. 10 shows a fifth example of gain control provided by the automatic gain controller.
Figure 11:
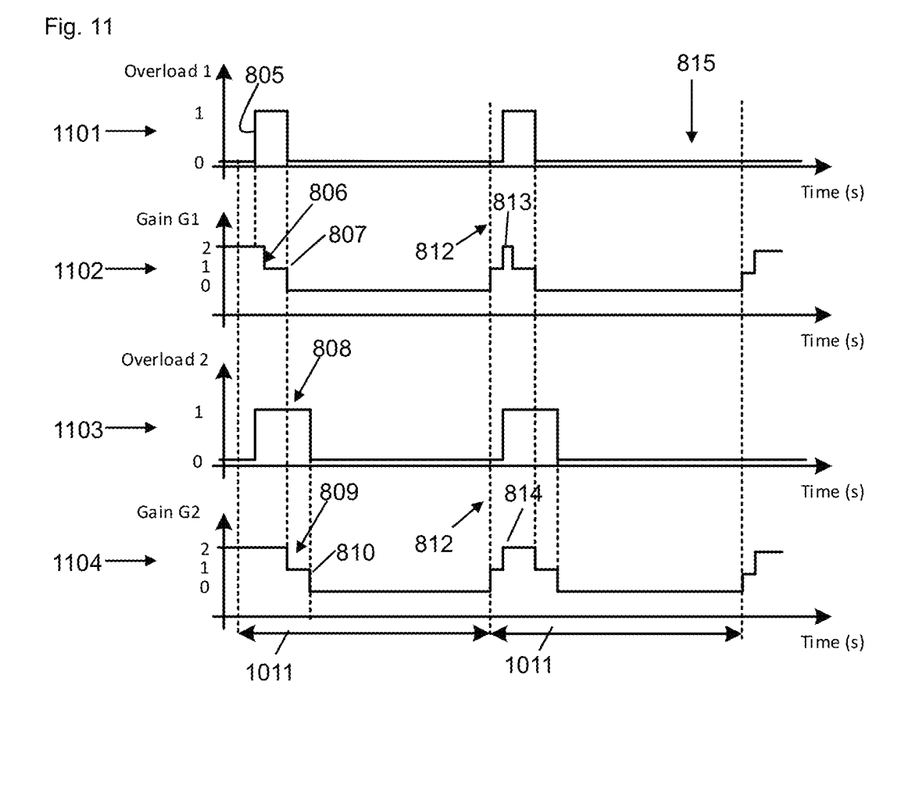
FIG. 11 shows a sixth example of gain control provided by the automatic gain controller.

FIGS. 10 and 11 are similar to FIGS. 8 and 9 but show a different time-based condition for directly increasing (FIG. 10) or stepwise increasing (FIG. 11) the gains G1 and G2 to their respective predetermined maximum gain threshold.

In the examples illustrated in FIGS. 10 and 11, the automatic gain controller is configured to provide for increasing of the gain of the first amplifier to a first-amplifier predetermined maximum gain threshold and increasing the gain of the second amplifier to a second-amplifier predetermined maximum gain threshold at periodic intervals independent of the absence or presence of the first overload signal and the second overload signal.

Thus, in these examples, the time period 1011 does not have a defined start point and is periodic. Thus, the AGC 101 may, at regular intervals defined by time period 1011, provide for a direct change to the respective predetermined maximum gain threshold or a stepwise increase in the gain to the respective predetermined maximum gain threshold.

In other examples, the time period 1011 may vary randomly, based on reception conditions, or one or more other factors.

Figure 12:
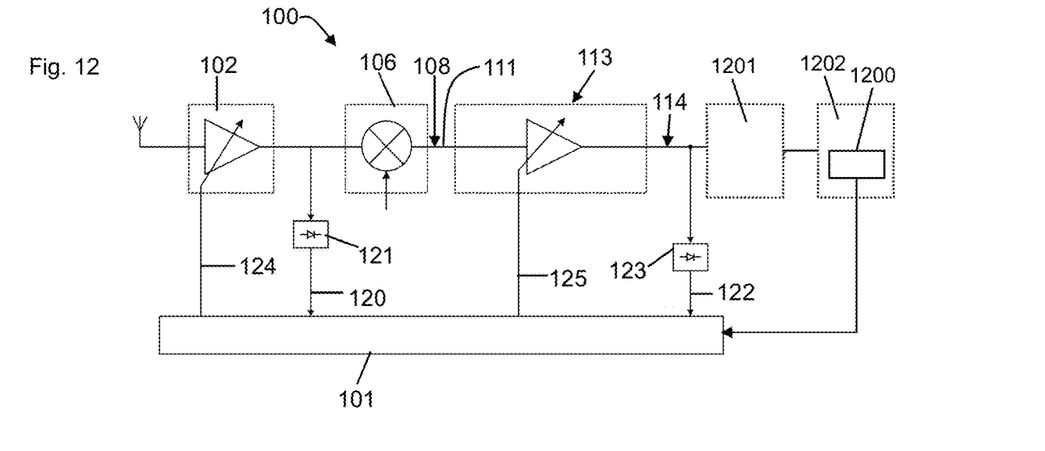
FIG. 12 shows a third example embodiment of a receiver including an example automatic gain controller and an RSSI detector.

FIG. 12 illustrates a further example that includes the AGC receiving a received signal strength indicator signal (RSSI signal) from an RSSI detector 1200. The example of FIG. 12 is substantially similar to FIG. 5 and the same reference numerals have been used. In this example, the output 114 of the second amplifier is shown coupled to an analogue to digital (ADC) convertor 1201 configured to receive the second amplified signal and provide a digital signal based thereon to a digital domain part 1202 of the receiver 100. The digital domain part 1202 includes said RSSI detector 1200.

The RSSI detector 1200 gives the AGC 101 information on the power of the wanted channel and, in one or more embodiments, only the wanted channel. As such, the RSSI detector 1200 may calculate and provide the RSSI signal after narrowband filtering, i.e. filtering of the second amplified signal such that the RSSI signal represents the wanted signal strength only, in case the bandwidth of the intermediate frequency signal exceeds the wanted signal bandwidth.

In one or more examples, the AGC 101 may be configured to perform the following: based on the absence of the first and second overload signals and the RSSI signal representative of the signal strength of a third frequency range of a digitized version of the second amplified signal, the third frequency range equal to or less than the second frequency range, provide for reduction of a respective gain of one or both of the first amplifier and the second amplifier to a respective gain value based on a predetermined minimum signal to noise ratio for demodulation of the received signal by the receiver.

In one or more examples, the AGC 101 may be configured to provide for said reduction of a respective gain based on a look up table or function that relates the RSSI signal to one or more respective gain values for the first and/or second amplifier.

Figure 13:
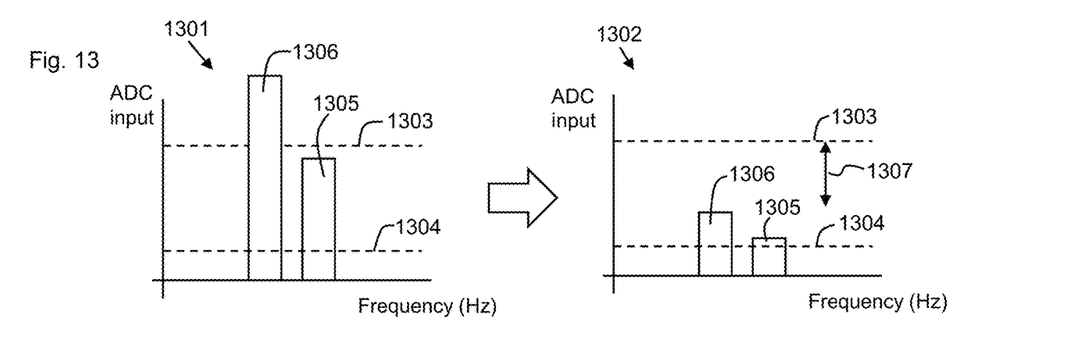
FIG. 13 shows two example plots of further gain control provided by the automatic gain controller.

In one or more examples, this may be advantageous in the event the receiver 100 receives a strong interferer signal. With reference to FIG. 13, the two plots 1301, 1302 show the amplitude of the signal received at the ADC 1201 versus frequency. The upper dashed line 1303 shows the maximum signal amplitude that can be received by the ADC 1201 before saturation, i.e. its full-scale limit. The lower dashed line 1304 shows the minimum signal amplitude of a signal received by the ADC1201 that has a signal to noise ratio such that it can be successfully demodulated by the receiver 100. This minimum signal amplified may calculated during use or may be predetermined.

The left-hand plot 1301 shows the gain of the amplifiers 102, 113 set to a value that just prevents both of the first and second overload signals being received. Accordingly, the digitized second amplified signal is likely to have a maximum or near maximum signal to noise ratio. The RSSI signal may be based on the digitized signal when such gain settings are applied. The plot 1301 shows the wanted signal 1305 and an interferer signal 1306. In one or more examples, if the interferer signal 1306 is not seen by the first overload detector or is present after the gain has been fixed for reception of a frame or packet, the ADC 1201 may be saturated by its presence.

However, by providing the above-mentioned further step of reducing the gain value based on a predetermined minimum signal to noise ratio 1304 for demodulation of the received signal 1305 by the receiver, headroom 1307 may be provided by setting the respective gain values G1 and G2 so that in the event of an interferer signal 1306 appearing, the ADC may be less likely to experience saturation while the wanted signal can be successfully demodulated.

The Look Up Table (LUT) or function may set the gains of the receiver so that a margin of 20 dB to 120 dB is expected between the power of the wanted signal at the input of the ADC 1201 and the full scale of the ADC 1201.

Figure 14:
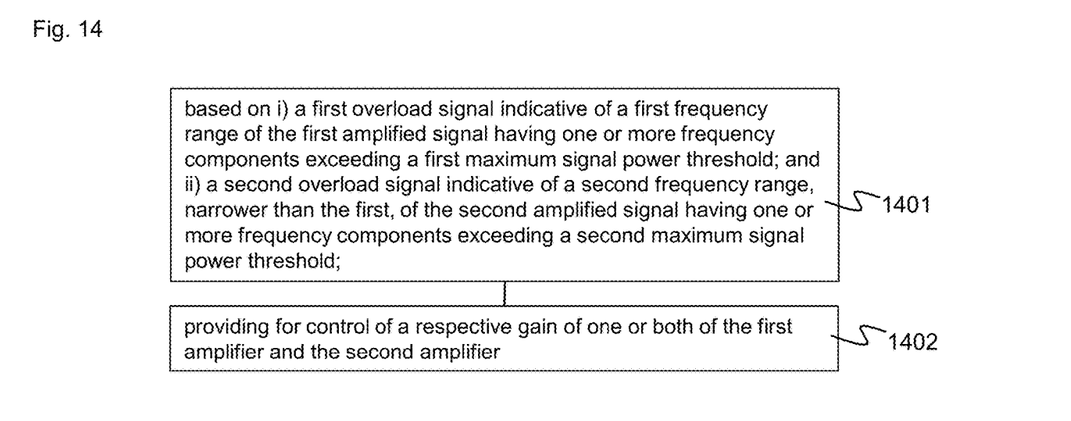
FIG. 14 shows a flowchart illustrating an example method.

FIG. 14 shows a method comprising the steps of based 1401 on i) a first overload signal indicative of a first frequency range of the first amplified signal having one or more frequency components exceeding a first maximum signal power threshold; and ii) a second overload signal indicative of a second frequency range, narrower than the first, of the second amplified signal having one or more frequency components exceeding a second maximum signal power threshold; providing 1402 for control of a respective gain of one or both of the first amplifier and the second amplifier.

Figure 15:
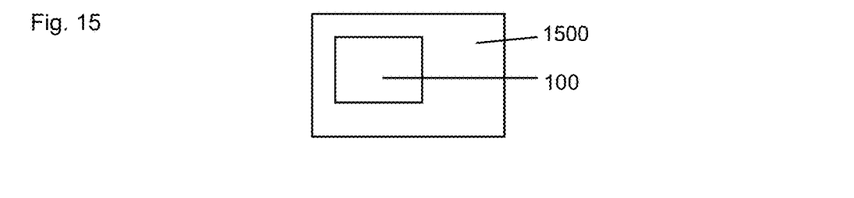
FIG. 15 shows an electronic device.

The example receivers 100 of FIGS. 1, 5 and 12 may form part of an electronic device 1500 as shown in FIG. 15 and the electronic device may be configured to use a signal output by the receiver, such as from the digital domain part, to perform one or more of its functions. For example, the electronic device may comprise an IoT controller or hub device, a wireless sensor, a headset, or any other electronic device requiring wireless communication via said receiver.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:
i) a first overload signal generated by the receiver which is indicative of a first frequency range of the first amplified signal having one or more frequency components exceeding a first maximum signal power threshold, and
ii) a second overload signal generated by the receiver which is indicative of a second frequency range, narrower than the first frequency range, of the second amplified signal having one or more frequency components exceeding a second maximum signal power threshold; and
wherein the automatic gain controller is configured to provide for one or both of increasing the gain of the first amplifier to a first-amplifier predetermined maximum gain threshold and increasing the gain of the second amplifier to a second-amplifier predetermined maximum gain threshold based on an elapse of a threshold time period during which the first overload signal and the second overload signal are absent.

2. The automatic gain controller of claim 1 configured to provide for decreasing of the gain of the first amplifier based on the first overload signal being provided to the automatic gain controller, prior to providing for decreasing of the gain of the second amplifier based on the second overload signal being provided to the automatic gain controller.

3. The automatic gain controller of claim 1 configured to provide for decreasing of the gain of the first amplifier while maintaining the gain of the second amplifier at a second-amplifier predetermined maximum gain value, until a first-gain-adjustment-condition is met comprising one of (i) the first overload signal is no longer provided to the automatic gain controller and (ii) the gain of the first amplifier is set to a predetermined minimum gain value.

4. The automatic gain controller of claim 3, configured to provide for, only once the first-gain-adjustment-condition is met, decreasing of the gain of the second amplifier based on the second overload signal being provided to the automatic gain controller.

5. The automatic gain controller of claim 1, wherein the increasing of the gain of the first amplifier to the first-amplifier predetermined maximum gain threshold and increasing the gain of the second amplifier to the second-amplifier predetermined maximum gain threshold is provided by one of:
i) direct change to the respective predetermined maximum gain threshold; and
ii) stepwise increase in the gain to the respective predetermined maximum gain threshold.

6. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:
i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold; and wherein the automatic gain controller is configured to provide for one or both of increasing the gain of the first amplifier to a first-amplifier predetermined maximum gain threshold and increasing the gain of the second amplifier to a second-amplifier predetermined maximum gain threshold at periodic intervals independent of the absence or presence of the first overload signal and the second overload signal.

7. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:

i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold; and wherein the automatic gain controller is configured to provide for setting of the gain of the second amplifier to a second-amplifier predetermined maximum gain threshold based on the automatic gain controller being caused to decrease the gain of the first amplifier.

8. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:

i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold; and wherein the provision of control of the respective gain of one or both of the first amplifier and the second amplifier is performed independent of signaling indicative of one or both of:

i) the first amplified signal having one or more frequency components below a first minimum signal power threshold; and ii) the second amplified signal having one or more frequency components below a second minimum signal power threshold.

9. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:

i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold; and wherein the mixer is configured to provide the intermediate frequency signal having in-phase (I) and quadrature (Q) components and the second overload signal is based on one of:

i) $|I|+|Q|$ being greater than the second maximum signal power threshold;

ii) the maximum of $|I|$ or $|Q|$ being greater than the second maximum signal power threshold; and iii) $|I|$ being greater than the second maximum signal power threshold.

10. An automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, wherein the automatic gain controller is configured to provide for control of a respective gain of one or both of the first amplifier and the second amplifier based on:

i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold; and wherein the automatic gain controller is configured to perform the following: based on an absence of the first and second overload signals and an RSSI signal representative of the received signal strength information of a digitized version of the second amplified signal and of a third frequency range, the third frequency range equal to or less than the second frequency range, provide for a reduction of a respective gain of one or both of the first amplifier and the second amplifier to a respective gain value based on a predetermined minimum signal-to-noise ratio for demodulation of the digitized version of the second amplified signal by the receiver.

11. A method of operation of an automatic gain controller for a receiver comprising at least a first amplifier configured to receive a received signal and provide a first amplified signal based thereon, a mixer configured to receive the first amplified signal and provide an intermediate frequency signal based thereon and a second amplifier configured to receive the intermediate frequency signal and provide a second amplified signal based thereon, the method comprising providing for control of a respective gain of one or both of the first amplifier and the second amplifier based on:

i) a first overload signal generated by the receiver which is indicative of a first frequency range of the first amplified signal having one or more frequency components exceeding a first maximum signal power threshold, and ii) a second overload signal generated by the receiver which is indicative of a second frequency range, narrower than the first frequency range, of the second amplified signal having one or more frequency components exceeding a second maximum signal power threshold, where the automatic gain controller is configured to provide for one or both of increasing the gain of the first amplifier to a first-amplifier predetermined maximum gain threshold and increasing the gain of the second amplifier to a second-amplifier predetermined maximum gain threshold based on an elapse of a threshold time period during which the first overload signal and the second overload signal are absent.

* * * * *